US006845407B1

United States Patent
Park et al.

(10) Patent No.: US 6,845,407 B1
(45) Date of Patent: Jan. 18, 2005

(54) SEMICONDUCTOR MEMORY DEVICE HAVING EXTERNALLY CONTROLLABLE DATA INPUT AND OUTPUT MODE

(75) Inventors: Yong-Jin Park, Yongin (KR); Sang-keun Park, Yongin (KR); Hong Kim, Suwon (KR); Young-gu Kang, Hanam (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 385 days.

(21) Appl. No.: 09/621,925

(22) Filed: Jul. 24, 2000

(30) Foreign Application Priority Data

Jul. 23, 1999 (KR) ............................................ 99-30029

(51) Int. Cl.[7] ................................................ G06F 3/00
(52) U.S. Cl. ......................... 710/14; 714/718; 714/719; 257/48; 257/200; 257/213
(58) Field of Search .................... 710/14; 714/718–719; 365/201; 257/48, 200, 213; 371/22.1–22.6

(56) References Cited

U.S. PATENT DOCUMENTS

| | | | |
|---|---|---|---|
| 5,177,745 A | * 1/1993 | Rozman | ...................... 714/718 |
| 5,526,364 A | * 6/1996 | Roohparvar | ................ 714/724 |
| 5,953,273 A | * 9/1999 | Ikegami | ....................... 365/201 |
| 5,978,948 A | * 11/1999 | Ohta | ............................ 714/736 |
| 6,138,255 A | * 10/2000 | Noji | ............................ 714/719 |

* cited by examiner

*Primary Examiner*—Jeffrey Gaffin
*Assistant Examiner*—Mike Nguyen
(74) *Attorney, Agent, or Firm*—Marger Johnson & McCollom, P.C.

(57) ABSTRACT

A semiconductor memory device having an externally controllable input and output mode is provided. The semiconductor memory device includes a first and second plurality of pads and an input and output mode set circuit electrically connected to the first plurality of pads and the second plurality of pads, for generating a plurality of input and output mode signals. The input and output mode set circuit cuts off signals received from the first plurality of pads, controls the level of each of the input and output mode signals to be at either a logic high level and a logic low level, and sets the input and output mode when a voltage higher than the supply voltage of the semiconductor memory device is applied to one of the second plurality of pads in a test mode. The high voltage is not applied to the second plurality of pads and the input and output mode set circuit controls the level of the input and output mode signals to be at either a logic high level or a logic low level, and thus sets the semiconductor memory device to have one input and output mode responsive to signals received from the plurality of pads, during a normal operation. Accordingly, it is possible to externally change the input and output mode of the semiconductor memory device.

14 Claims, 10 Drawing Sheets

SEMICONDUCTOR MEMORY DEVICE HAVING EXTERNALLY CONTROLLABLE DATA INPUT AND OUTPUT MODE

BACKGROUND OF THE INVENTION

1. Field of the Invention

The present invention relates to a semiconductor memory device, and more particularly, to a semiconductor memory device having externally controllable data input and output mode.

2. Description of the Related Art

A semiconductor memory device includes storage elements. A user can write data into or read data out from these storage elements. That is, a user can input or output data to and from the memory device. A plurality of data items can be simultaneously input and output. The number of data items simultaneously input to and output from the memory device depends on the input and output mode set by the manufacturer during manufacturing. For example, the manufacturer can set the input and output mode to ×4, ×8, and ×16. When the input and output mode is set to ×4, the number of data items simultaneously input to and output from the memory is 4. When the input and output mode is set to ×8, the number of data items simultaneously input to and output from the memory is 8. When the input and output mode is set to ×16, the number of data items simultaneously input to and output from the memory is 16. The input and output mode for a given memory device is set when the semiconductor memory device is designed. An input and output mode controlling circuit sets the input and output mode.

FIG. 1 is a circuit diagram of the input and output mode controlling circuit included in a conventional semiconductor memory device. Referring to FIG. 1, a conventional input and output mode controlling circuit 101 includes a first input and output mode setting unit 111 and a second input and output mode setting unit 112. The first input and output mode setting unit 111 sets the mode to ×16. The second input and output mode setting unit 112 sets the mode to ×4. When a signal P16 is at a logic high level, the input and output mode of the semiconductor memory device 101 is set to ×16. When a signal P4 is at the logic high level, the input and output mode of the semiconductor memory device 101 is set to ×4. When the signals P4 and P16 are both at logic low levels, the input and output mode of the semiconductor memory device 101 is set to ×8. The signals P4 and P16 are never both simultaneously at logic high levels.

The first input and output mode setting unit 111 includes a pad 121, an NMOS transistor 131, a PMOS transistor 141, and inverters 151 through 153. The second input and output mode setting unit 112 includes a pad 122, an NMOS transistor 132, a PMOS transistor 142, and inverters 154 through 156. When the input and output mode of the semiconductor memory device 101 is to be set to be ×16, the pad 121 is grounded. When the input and output mode of the semiconductor memory device is set to be ×4, the pad 122 is grounded. The NMOS transistors 131 and 132, and the PMOS transistors 141 and 142, are always turned on by providing a supply voltage Vcc to the semiconductor memory device 101. The PMOS transistors 141 and 142 are smaller than the NMOS transistors 131 and 132.

When the pad 121 is grounded, the voltage level of node N1 is decreased to the level of a ground voltage GND. Accordingly, the signal P16 is at the logic high level. When the pad 121 floats, the voltage level of the node N1 is increased to the level of the supply voltage Vcc. Accordingly, the signal P16 is at the logic low level. When the pad 121 floats and the pad 122 is grounded, the voltage level of the node N2 is decreased to the level of the ground voltage GND. Accordingly, the signal P4 is at the logic high level. When the pad 122 floats, the voltage level of the node N2 is increased to the level of the supply voltage Vcc. Accordingly, the signal P4 is at the logic low level. When the pads 121 and 122 both float, the signals P4 and P16 are at the logic low level. Namely, the input and output mode of the semiconductor memory device is set to ×8.

In the conventional semiconductor memory device 101, the input and output mode cannot be changed after the device is packaged. The fixed input and output mode leads to the following problems. First, productivity is lowered because the semiconductor memory device must be tested in each input and output mode. Second, test efficiency is reduced cause the driving capability depends on the input and output mode of the semiconductor memory device. Third, since specifications are classified during the evaluation of the semiconductor memory device, it is difficult to completely characterize the semiconductor memory device in each input and output mode.

SUMMARY OF THE INVENTION

An object of the present invention is to address the above-mentioned disadvantages associated with prior art semiconductor memory devices.

Another object of the present invention is to provide a semiconductor memory device having an externally controllable input and output mode.

A semiconductor device is provided. The semiconductor device comprises a first plurality of pads adapted to receive a corresponding plurality of first external signals. A second plurality of pads is adapted to receive a corresponding plurality of second external signals. An input and output mode set circuit is coupled to the first and second plurality of pads and is adapted to generate a plurality of input and output mode signals responsive to the plurality of first and second external signals. During a test mode, the input and output mode set circuit is adapted to generate the plurality of input and output mode signals responsive only to the plurality of first external signals, the plurality of first pads receiving a high voltage higher than a voltage level of a power supply signal thereby generating a plurality of first external signals having a level higher than a voltage level of the power supply signal. During normal operations, the input and output mode set circuit is adapted to generate the plurality of input and output mode signals responsive to the plurality of second external signals, the plurality of second external signals having logic levels.

The high voltage is applied to the plurality of first pads only for a short period of time. The supply signal is applied to the semiconductor memory device after the high voltage is applied to one of the first plurality of pads. The plurality second pads either float or at least one of the second pads is grounded.

The input and output mode set circuit comprises a pad circuit coupled to the first plurality of pads and adapted to generate a plurality of first signals, one of the plurality of first signals being active when the high voltage is applied to at least one of the first plurality of pads. A control signal generating circuit is adapted to generate a plurality of control signals responsive to the plurality of first signals and a plurality of second signals. An input and output mode signal generating circuit is adapted to generate the plurality of input and output mode signals responsive to the plurality of control signals and the plurality of second external signals.

The plurality of second signals comprises a power supply sense signal activated when the power supply signal has a level equal to or greater than a predetermined level and input and output mode control signal activate responsive to a write enable signal, a row address strobe signal, and a column address strobe signal.

According to another aspect of the present invention, a semiconductor memory device is provided that comprises a plurality of pads for receiving a corresponding plurality of external signals. An input and output mode set circuit is coupled to the plurality of pads and is adapted to generate a plurality of input and output mode signals. During a test mode, the input and output mode set circuit is adapted to generate the plurality of input and output mode signals responsive to a plurality of mode register address signals. During normal operation, the input and output mode set circuit is adapted to generate the plurality of input and output mode signals responsive to the plurality of external signals received at the plurality of pads.

Each of the plurality of pads either float or at least one of the pads is grounded.

The input and output mode set circuit comprises a mode register set circuit and is adapted to receive a group of the plurality of mode register address signals and first and second internal signals and adapted to generate first and second mode register signals responsive to the group of mode register address signals and the first and second internal signals. A control signal generating circuit is adapted to generate a plurality of control signals responsive to the first and second mode register signals, a remaining group of the plurality of mode register address signals, the first internal signal, and a third internal signal. An input and output mode signal generator is adapted to receive the plurality of control signals, cut off signals the plurality of external control signals responsive to at least one of the plurality of control signals, and generate the plurality of input and output mode signals responsive to the remaining control signals.

The first internal signal is a power supply sense signal enabled when a power supply has a level equal to or greater than a predetermined level and the second internal signals is enabled when a write enable signal, a row address strobe signal, and a column address strobe signal are enabled.

During the normal operation, the second mode register signal and the first and second internal signals are deactivated thereby deactivating the first, second, and third control signals and wherein the input and output mode signal generating circuit is adapted to generate the input and output mode signals responsive to the plurality of external signals According to the present invention, it is possible to externally change and control the input and output mode of the semiconductor memory device.

BRIEF DESCRIPTION OF THE DRAWINGS

The above object and advantages of the present invention will become more apparent by describing in detail a preferred embodiment thereof with reference to the attached drawings.

DESCRIPTION OF THE PREFERRED EMBODIMENT

Figure 1:
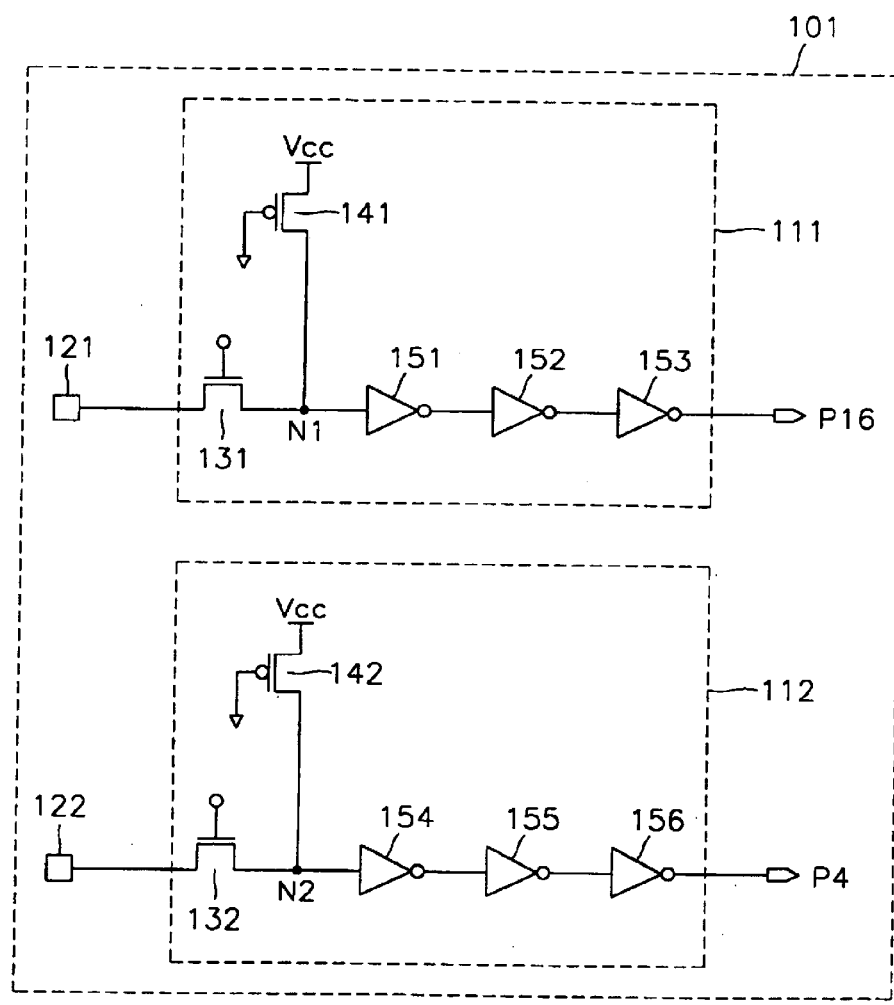
FIG. 1 is a circuit diagram of an input and output mode controlling circuit included in a conventional semiconductor memory device.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. The same reference numerals in different drawings represent the same element, and thus their description will be omitted.

Figure 2:
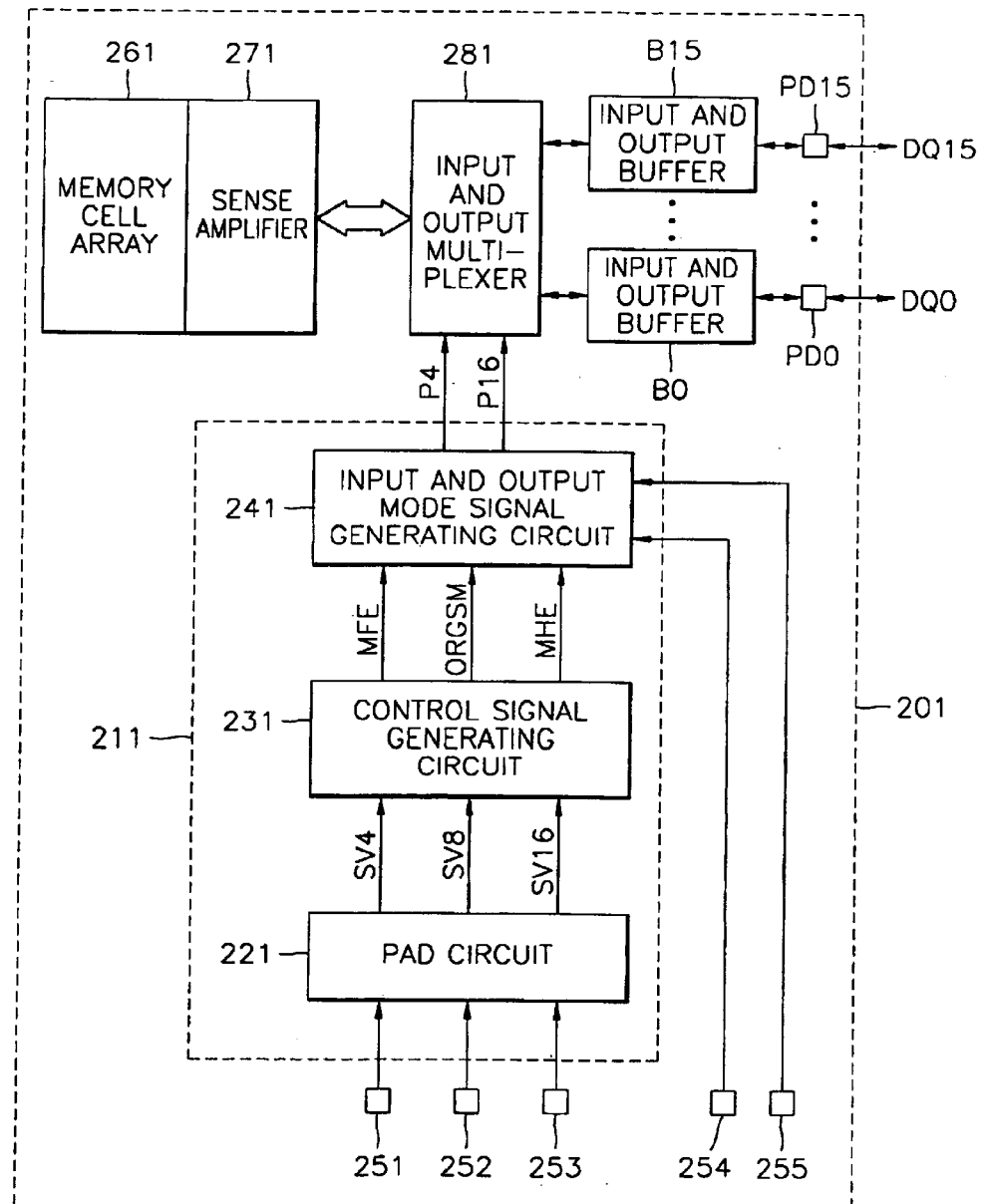
FIG. 2 is a schematic block diagram of a semiconductor memory device according to a first embodiment of the present invention.

FIG. 2 is a schematic block diagram of a semiconductor memory device according to a first embodiment of the present invention. Referring to FIG. 2, a semiconductor memory device 201 according to the first embodiment of the present invention includes a memory cell array 261, a sense amplifier 271, an input and output multiplexer 281, an input and output mode set circuit 211, input and output buffers B0 through B15, and pads 251 through 255 and PD0 through PD15.

Pads 251 through 253 are basically included in the semiconductor memory device 201. During normal operation, external signals are applied to the pads 251 through 253. In a test mode, a voltage higher than the supply voltage Vcc of the semiconductor memory device 201 is applied to one of the pads 251 through 253. Pads 254 and 255 are wire bonded, and are thus grounded to a ground terminal or float during packaging. The input and output mode of the semiconductor memory device 201 is set according to whether the pads 254 and 255 are grounded or float. For example, when the pad 254 is grounded, the input and output mode of the semiconductor memory device 201 is set to x4. When the pad 255 is grounded, the input and output mode of the semiconductor memory device 201 is set to x16. When both pads 254 and 255 float, the input and output mode of the semiconductor memory device 201 is set to x8. The pads 254 and 255 are never both simultaneously grounded.

The input and output mode set circuit 211 is electrically connected to the pads 251 through 253. The input and output mode set circuit 211 generates input and output mode signals P4 and P16 responsive to a high voltage applied to one of the pads 251 through 253 while in a test mode. At this time, the input and output mode set circuit 211 prevents signals applied to the pads 254 and 255 from being input. The input and output mode of the semiconductor memory device 201 is set according to which of pads 251 through 253 the high voltage is applied. For example, when the high voltage is applied to the pad 251, the input and output mode signal P4 is at a logic high level. Accordingly, the input and output mode of the semiconductor memory device 201 is set to ×4. When the high voltage is applied to the pad 252, the input and output mode signals P4 and P16 are at a logic low level. Accordingly, the input and output mode of the semiconductor memory device 201 is set to ×8. When the high voltage is applied to the pad 253, the input and output mode signal P16 is at the logic high level. Accordingly, the input and output mode of the semiconductor memory device 201 becomes ×16.

The input and output mode set circuit 211 includes a pad circuit 221, a control signal generating circuit 231, and an input and output mode signal generating circuit 241.

Figure 3:
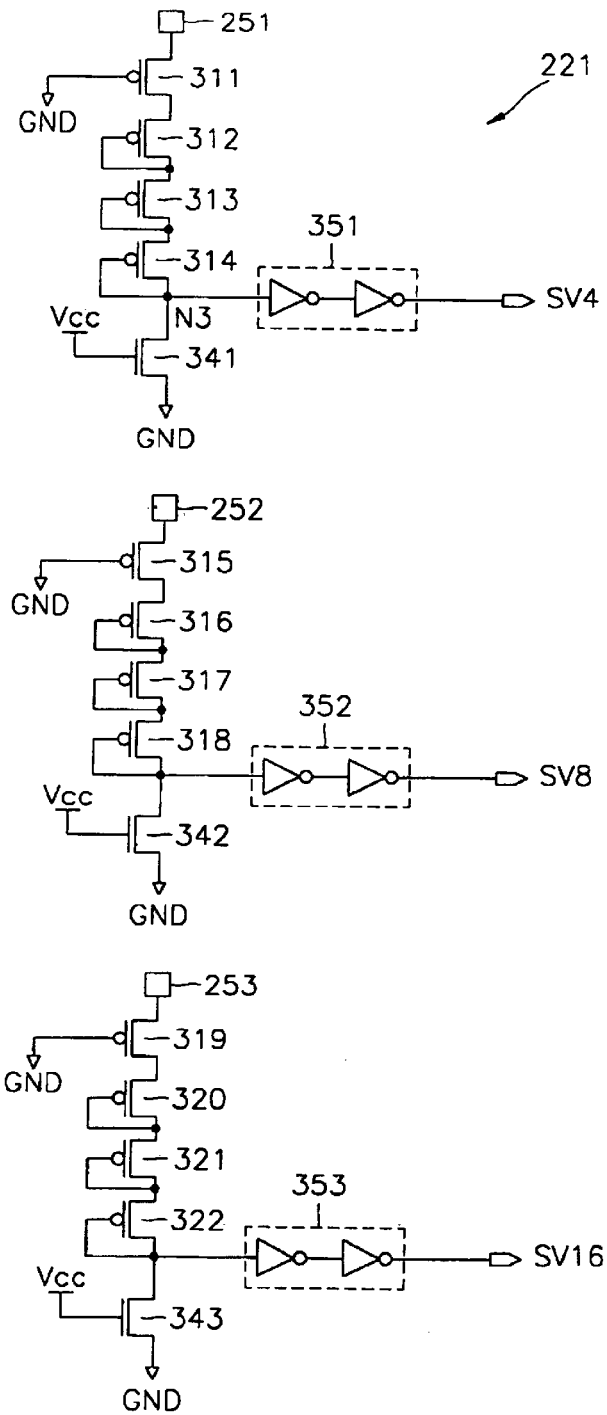
FIG. 3 is a circuit diagram of the pad circuit shown in FIG. 2.

The pad circuit 221 is shown in detail in FIG. 3. Referring to FIG. 3, the pad circuit 221 is electrically connected to the pads 251, 252, and 253 and includes PMOS transistors 311 through 322, NMOS transistors 341 through 343, and buffers 351 through 353. Each of the buffers 351 through 353 consists of an even number of inverters. The buffers 351 through 353 generate first through third signals SV4, SV8, and SV16. The NMOS transistors 341 through 343 are turned on as long as the supply voltage Vcc is applied to the semiconductor memory device 201. Therefore, when a high voltage is not applied to the pads 251 through 253, the first through third signals SV4, SV8, and SV16, respectively, are at the logic low level.

When a high voltage, for example, 8 volts is applied to the pad 251, since the PMOS transistors 311 through 314 are turned on, the voltage level of node N3 is increased to 5.2 volts. The threshold voltage of the PMOS transistors 311 through 314 is 0.7 volts. The PMOS transistors 311 through 314 are much smaller than the NMOS transistor 341. Therefore, the first signal SV4 is activated to a logic high level. When the high voltage is applied to the pad 252 by the same principle, the second signal SV8 is activated to the logic high level. When the high voltage is applied to the pad 253, the third signal SV16 is activated to the logic high level.

Figure 4:
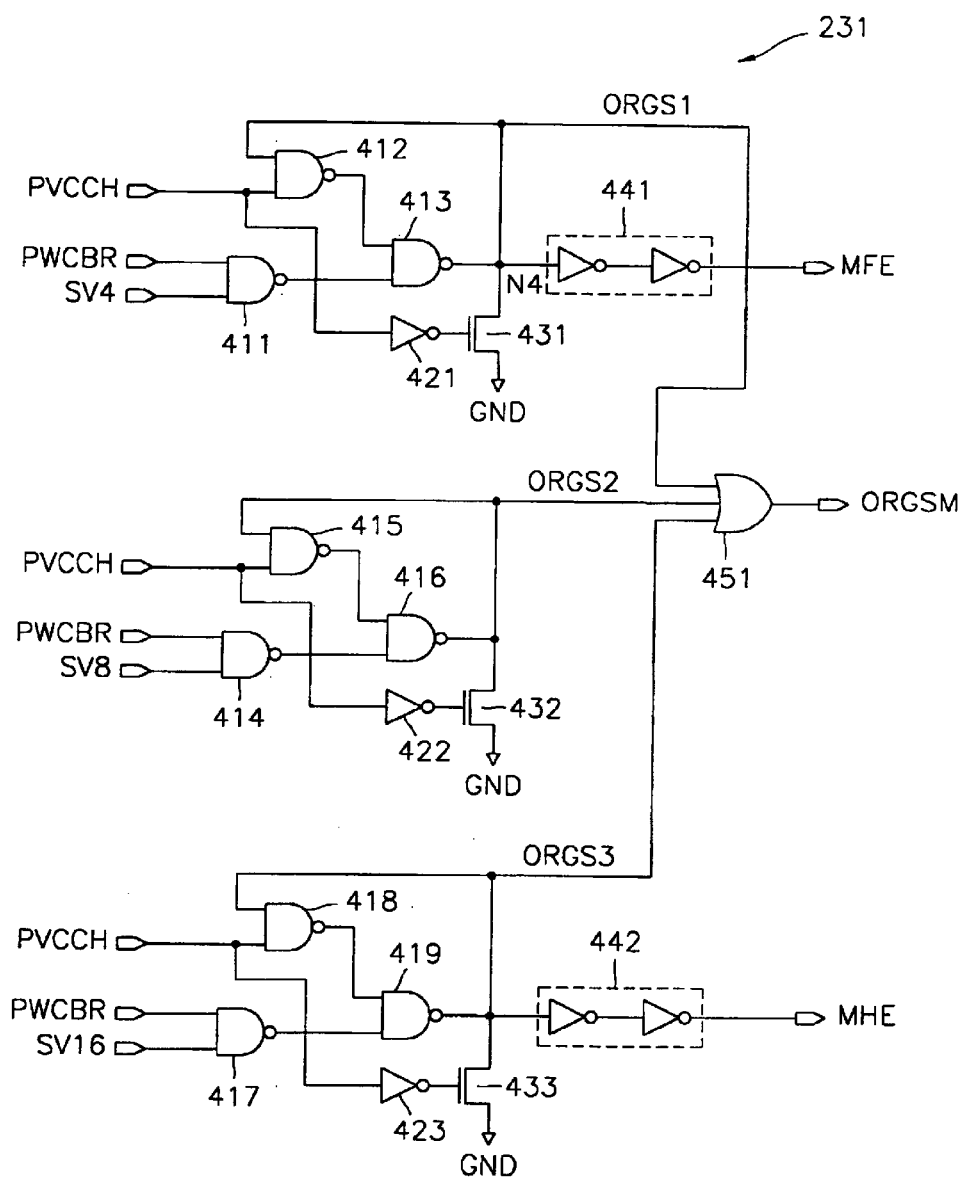
FIG. 4 is a circuit diagram of the control signal generating circuit shown in FIG. 2.

The control signal generating circuit 231 is shown in detail in FIG. 4. Referring to FIG. 4, the control signal generating circuit 231 includes NAND gates 411 through 419, inverters 421 through 423, NMOS transistors 431 through 433, buffers 441 and 442, and an OR gate 451. Each of the buffers 441 and 442 consists of an even number of inverters. The control signal generating circuit 231 receives a power supply sense signal PVCCH referred to as a first internal signal, a second internal signal PWCBR, and the first through third signals SV4, SV8, and SV16 and generates first through third control signals ORGSM, MFE, and MHE, respectively.

The power supply sense signal PVCCH is deactivated to the logic low level when the supply voltage Vcc is less than a predetermined voltage and is activated to the logic high level when the supply voltage Vcc is greater than the predetermined voltage. Therefore, when the supply voltage Vcc is applied to the semiconductor memory device 201, the power supply sense signal PVCCH is deactivated at an initial stage and is activated after a predetermined time has lapsed. The power supply sense signal PVCCH is continuously activated while the supply voltage Vcc is applied to the semiconductor memory device 201.

Figure 10:
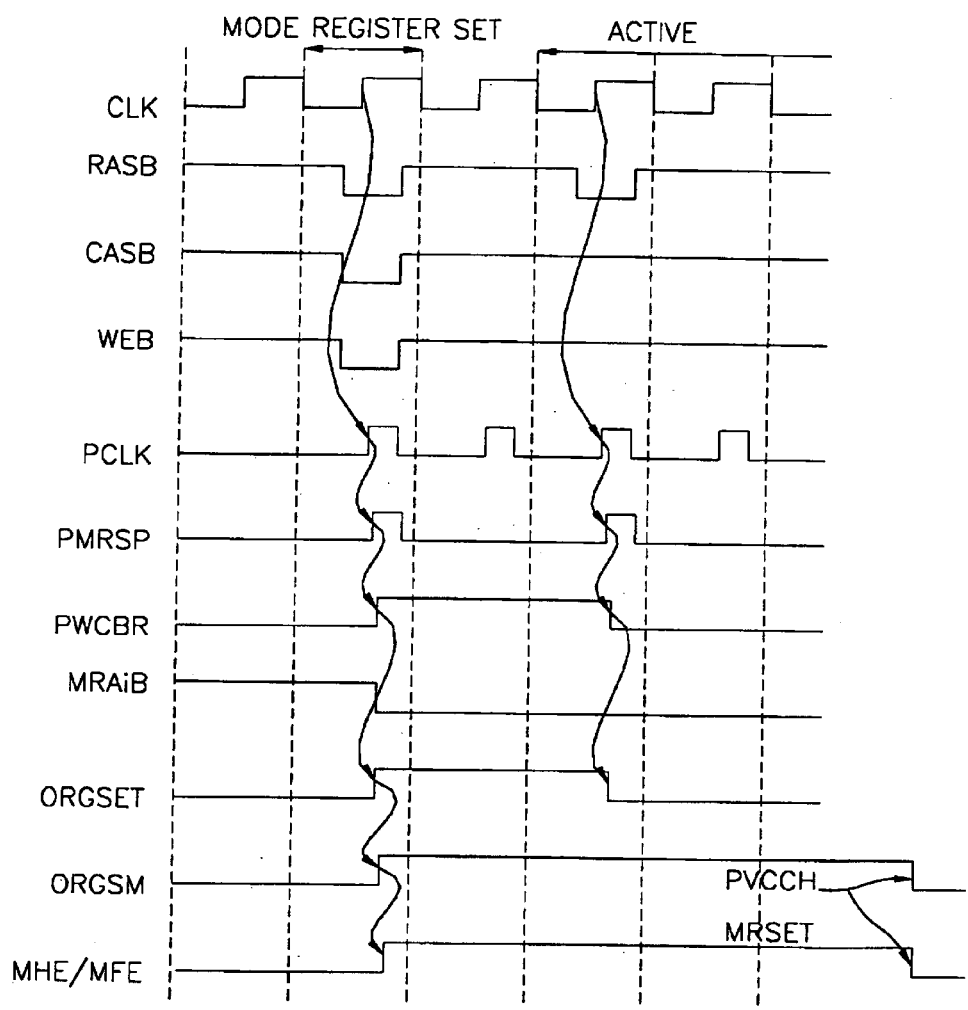
FIG. 10 is a timing diagram of the signals associated with the semiconductor memory device shown in FIG. 6.

As shown in FIG. 10, the second internal signal PWCBR is activated to the logic high level when a clock signal CLK transitions from the logic low level to the logic high level when a write enable signal WEB, a row address strobe signal RASB, and a column address strobe signal CASB are at the logic low level. Also, the second internal signal PWCBR is deactivated to the logic low level when the clock signal CLK transitions from the logic low level to the logic high level when one of the write enable signal WEB, the row address strobe signal RASB, and the column address strobe signal CASB is at the logic high level.

When the write enable signal WEB transitions to the logic low level, external data is written into memory cell array 261. When the row address strobe signal RASB transitions to the logic low level, a row address is externally input to the semiconductor memory device 201. When the column address strobe signal CASB is transited to the logic low level, a column address is input from the outside to the semiconductor memory device 201. The semiconductor memory device 201 is in the test mode when the second internal signal PWCBR transitions to the logic high level. Only one of the first through third signals SV4, SV8, and SV16 is at the logic high level at any given time.

When the second internal signal PWCBR is activated to the logic high level and the first signal SV4 is activated to the logic high level in the test mode, the NAND gate 411 outputs the logic low level. Then, the NAND gate 413 outputs the logic high level. Accordingly, a node N4 transitions to the logic high level. Since the power supply sense signal PVCCH is at the logic high level and the node N4 is at the logic high level, the NAND gate 412 outputs the logic low level. In this state, although the control signal SV4 is at the logic low level, the node N4 is maintained at the logic high level. Namely, the NAND gates 412 and 413 form a latch circuit. Accordingly, the node N4 is maintained at the logic high level while the supply voltage Vcc is applied to the semiconductor memory device 201. When the supply voltage Vcc is no longer provided, the NMOS transistor 431 is turned on and the node N4 is transited to the logic low level. The node N4 transitions to the logic low level when the supply voltage Vcc is applied to the inverter 421. When the supply voltage Vcc is not applied to the inverter 421, the node N4 floats. When the node N4 is at the logic high level, the first control signal ORGSM of the OR gate 451 is activated to the logic high level.

When the second signal SV8 is activated to the logic high level, a signal ORGS2 is activated to the logic high level according to the same manner. When the third signal SV16 is activated to the logic high level, a signal ORGS3 is activated to the logic high level. The first control signal ORGSM is activated to the logic high level when one of the signals ORGS1, ORGS2, and ORGS3 is at the logic high level. When the signals ORGS1 and ORGS3 are at the logic high level, the second and third signals MFE and MHE are activated to the logic high level.

Referring to FIGS. 3 and 4, when the supply voltage Vcc is applied to the semiconductor memory device 201 and the high voltage is applied to the pad 251, the signals ORGS1 and MFE are at the logic high level. The signals ORGS1 and MFE are maintained at the logic high level although the high voltage is not applied to the pad 251. Namely, the signals ORGS1 and MFE may be continuously generated at the logic high level although the high voltage is applied to the pad 251 only for a short period of time. Likewise, the signals ORGS2 and ORGSM are continuously held at the logic high level although the high voltage is applied to the pad 252 for a short period of time. The signals ORGS3, MHE, and ORGSM are continuously held at the logic high level although the high voltage is applied to the pad 253 for a short period of time.

When the supply voltage Vcc is turned off and then turned on in a state where the first signal SV4 is at the logic low level, the NMOS transistor 431 is instantaneously turned on, thus decreasing the voltage level of the node N4 to the ground voltage GND level. Then, the outputs of the NAND gates 411 and 412 transition to the logic high level. Accordingly, the output of the NAND gate 413 transition to the logic low level. Then, although the power supply sense signal PVCCH is activated, the node N4, namely, the signals ORGS1 and MFE are latched to the logic low level. This state is continuously maintained unless the output of the NAND gate 411 is at the logic low level. The above is true of the signals ORGS2, ORGS3, and MHE. When the signals ORGS1, ORGS2, and ORGS3 are at the logic low level, the first control signal ORGSM is deactivated to the logic low level.

Figure 5:
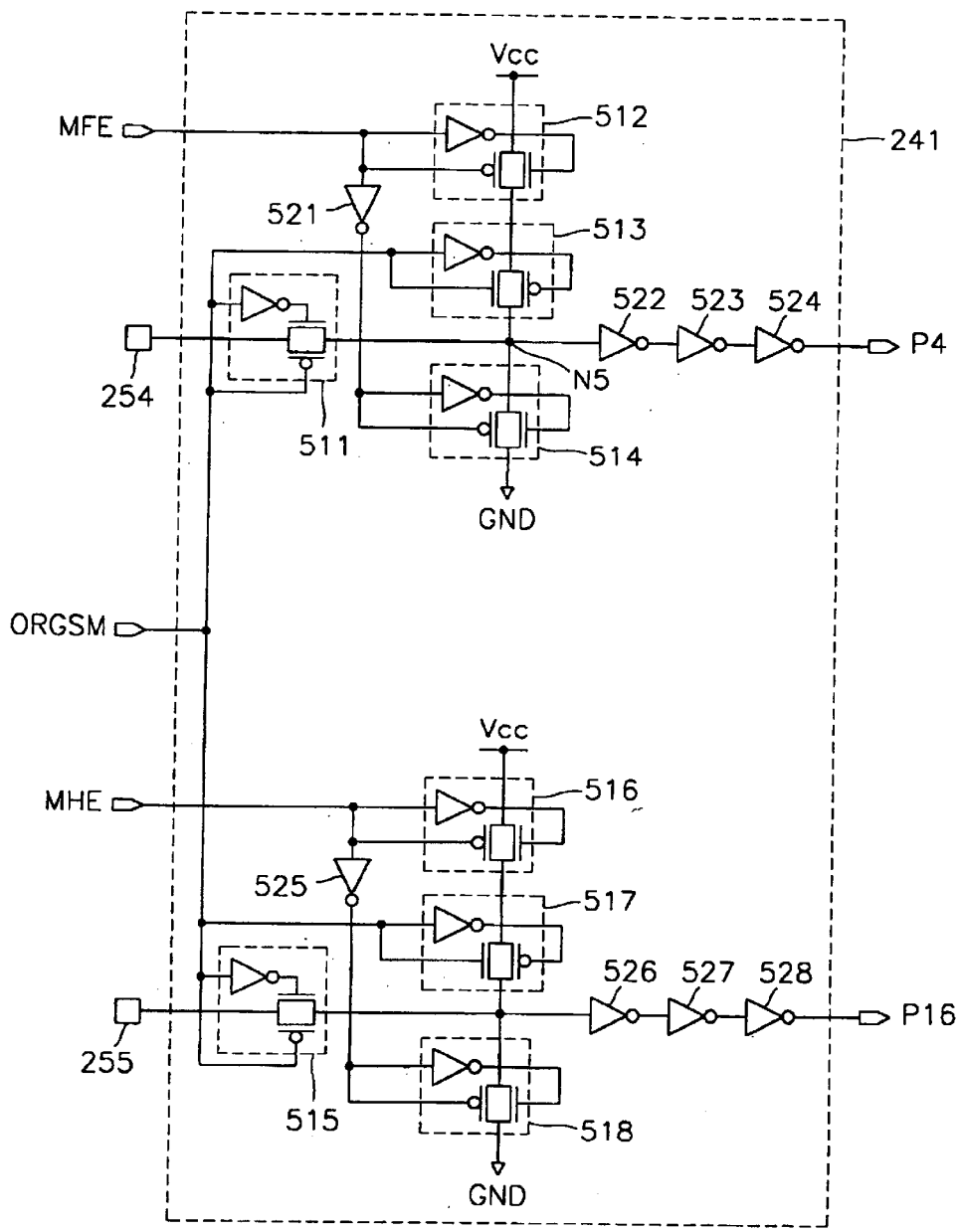
FIG. 5 is a circuit diagram of the input and output mode signal generating circuit shown in FIG. 2.

The input and output mode signal generating circuit 241 is shown in detail in FIG. 5. Referring to FIG. 5, the input and output mode signal generating circuit 241 includes transmission gates 511 through 518 and inverters 521 through 528. The first control signal ORGSM is activated to the logic high level in the test mode. When the first control signal ORGSM is at the logic high level, the transmission gates 511 and 515 are turned off and the transmission gates 513 and 517 are turned on. When the transmission gates 511 and 515 are turned off, they cut off signals applied to pads 254 and 255. In this state, when the second control signal MFE is activated to the logic high level, the transmission gate 514 is turned on and the voltage level of a node N5 is decreased to the ground voltage GND level. Therefore, the input and output mode signal P4 transitions to the logic high level. Accordingly, the input and output mode of the semiconductor memory device 201 is set to ×4. When the second control signal MFE is at the logic low level in a state where the first control signal ORGSM is activated, the transmission gate 512 is turned on and the transmission gate 514 is turned off. Then, the node N5 is increased to the supply voltage Vcc level. Accordingly, the input and output mode signal P4 transitions to the logic low level.

When the third control signal MHE is activated to the logic high level in a state where the first control signal ORGSM is activated to the logic high level, the transmission gate 518 is turned on and the voltage of a node N6 is decreased to the ground voltage GND level. Therefore, the input and output mode signal P16 transitions to the logic high level and the input and output mode of the semiconductor memory device 201 is set to ×16. When the third control signal MHE is at the logic low level in a state where the first control signal ORGSM is at the logic high level, the transmission gate 516 is turned on and the transmission gate 518 is turned off. Then, the node N6 is increased to the supply voltage Vcc level. Accordingly, the input and output mode signal P16 transitions to the logic low level.

When the second and third control signals MFE and MHE are deactivated to the logic low level in a state where the first control signal ORGSM is at the logic high level, the input and output mode signals P4 and P16 remain at the logic low level. Therefore, the input and output mode of the semiconductor memory device 201 is set to ×8. The second and third control signals MFE and MHE are never both at the logic high level when the first control signal ORGSM is at the logic high level.

Data externally applied to the pads PD0 through PD15 is written in the memory cell array 261 through buffers B0 through B15, the input and output multiplexer 281, and the sense amplifier 271. The data stored in the memory cell array 261 is read and output to the outside through the sense amplifier 271, the input and output multiplexer 281, the buffers B0 through B15, and the pads PD0 through PD15. The input and output multiplexer 281 controls the number of data items simultaneously input to and output from the memory cell array 261 according to the input and output mode of the semiconductor memory device 201. When the input and output mode of the semiconductor memory device 201 is ×4, the input and output multiplexer 281 simultaneously transmits four data items output from the memory cell array 261 through the sense amplifier 271 to the input and output buffers B0 through B15 or simultaneously transmits four data items received from the outside through the sense amplifier 271. When the input and output mode of the semiconductor memory device is ×8, the number of data items simultaneously input to and output from the memory cell array 261 is 8. When the input and output mode of the semiconductor memory device 201 is ×16, the number of data items simultaneously input to and output from the memory cell array 261 is 16.

The input and output mode of the semiconductor memory device 201 varies according to which pad among pads 251 through 253 receives the externally applied high voltage. Therefore, it is possible to completely characterize the semiconductor memory device in each input and output mode after the device is packaged.

Figure 6:
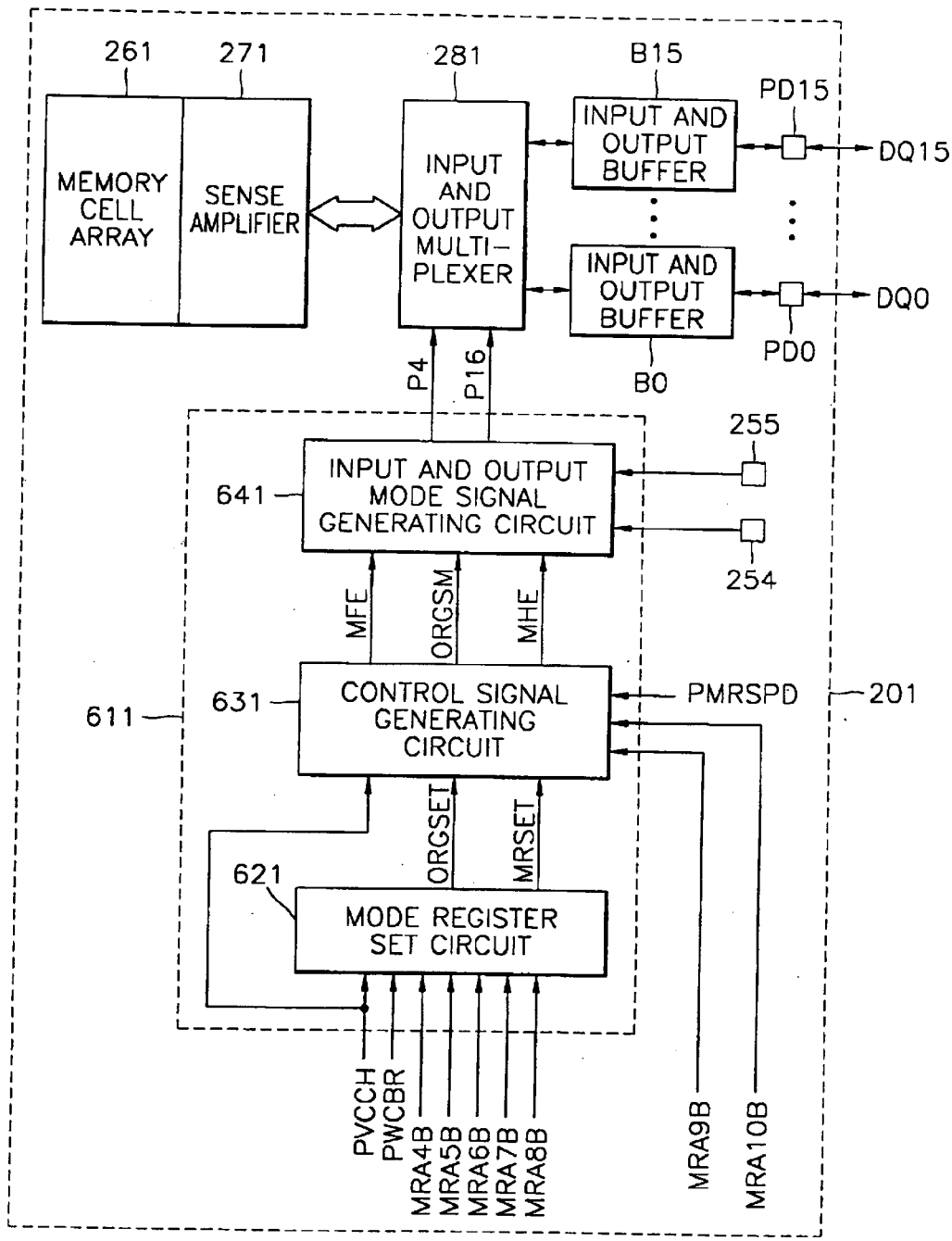
FIG. 6 is a schematic block diagram of a semiconductor memory device according to a second embodiment of the present invention.

FIG. 6 is a schematic block diagram of a semiconductor memory device according to a second embodiment of the present invention. Referring to FIG. 6, the semiconductor memory device 201 according to the second embodiment of the present invention includes the memory cell array 261, the sense amplifier 271, the input and output multiplexer 281, an input and output mode set circuit 611, the input and output buffers B0 through B15, and the pads PD0 through PD15.

The input and output mode set circuit 611 is electrically connected to the pads 254 and 255. The input and output mode set circuit 611 receives mode register address signals MRA4B through MRA10B, the power supply sense signal PVCCH referred to as the first internal signal, and second and third internal signals PWCBR and PMRSPD and generates the input and output mode signals P4 and P16. The input and output mode set circuit 611 includes a mode register set circuit 621, a control signal generating circuit 631, and an input and output mode signal generating circuit 641.

Figure 7:
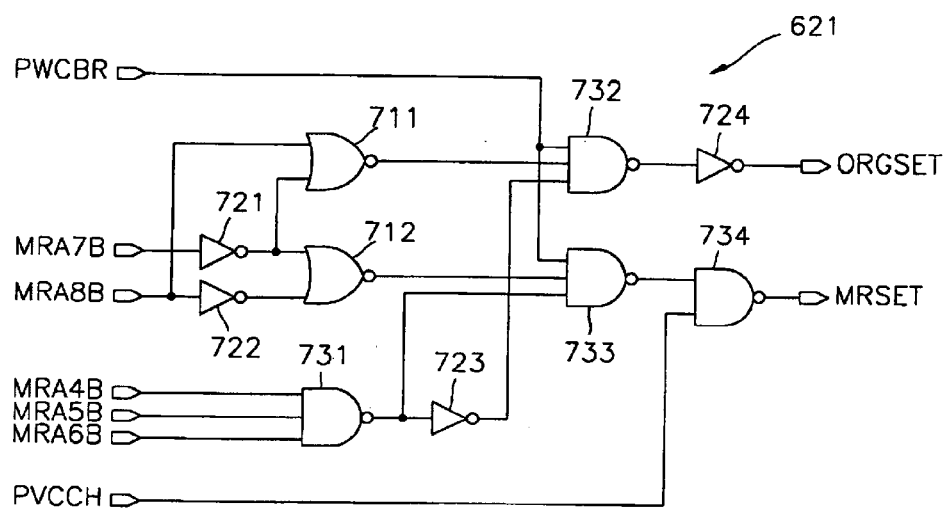
FIG. 7 is a circuit diagram of the mode register set signal generating circuit shown in FIG. 6.

The mode register set circuit 621 is shown in detail in FIG. 7. Referring to FIG. 7, the mode register set circuit 621 includes NOR gates 711 and 712, NAND gates 731 through 734, and inverters 721 through 724. The mode register set circuit 621 receives mode register address signals MRA4B through MRA8B, the power supply sense signal PVCCH, and the second internal signal PWCBR and generates first and second mode register signals ORGSET and MRSET, respectively. In order to activate the first mode register signal ORGSET to the logic high level, the mode register address signals MRA4B through MRA7B and the second internal signal PWCBR must be activated to the logic high level and the mode register address signal MRA8B must transition to the logic low level. When the mode register address signal MRA7B is at the logic high level and the mode register address signal MRA8B is at the logic low level, the output of the NOR gate 711 is at the logic high level. Also, when the mode register address signals MRA4B through MRA6B are at the logic high level, the output of the inverter 723 transitions to the logic high level. In this state, when the second internal signal PWCBR is activated to the logic high level, since signals input to the NAND gate 732 are at the logic high level, the first mode register signal ORGSET is activated to the logic high level. Here, the NAND gate 732 and the inverter 724 operate as an AND circuit.

The second mode register signal MRSET is at the logic high level when the power supply sense signal PVCCH is at the logic low level. Also, the second mode register signal MRSET is at the logic high level when the second internal signal PWCBR and the mode register address signals MRA7B and MRA8B are at the logic high level and one of the mode register address signals MRA4B through MRA6B is at the logic low level. When the mode register address signals MRA7B and MRA8B are at the logic high level, the NOR gate 712 outputs the logic high level. Also, when one of the mode register address signals MRA4B through MRA6B is at the logic low level, the NAND gate 731 outputs the logic high level. In this state, when the second internal signal PWCBR is at the logic high level, the output of the NAND gate 733 is at the logic low level. Therefore, the second mode register signal MRSET transitions to the logic high level by the NAND gate 734.

Figure 8:
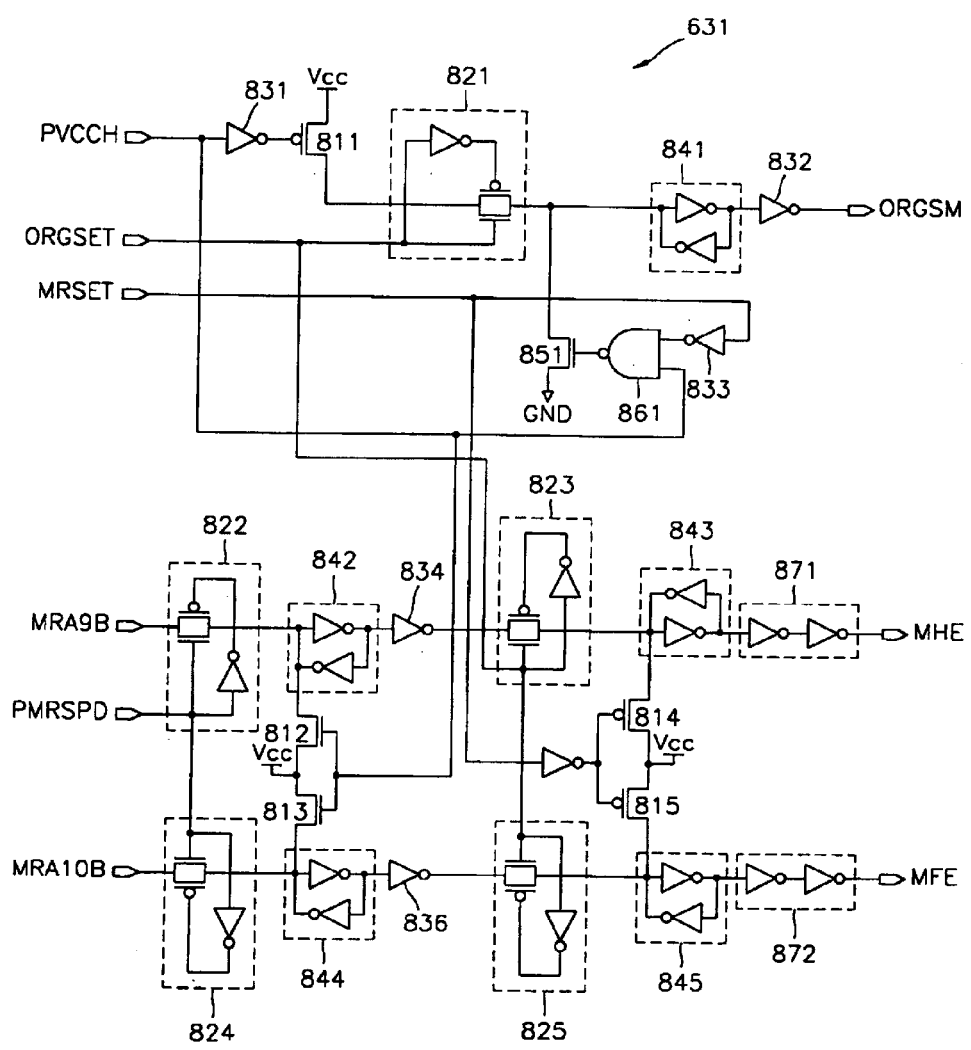
FIG. 8 is a circuit diagram of the control signal generating circuit shown in FIG. 6.

The control signal generating circuit 631 is shown in detail in FIG. 8. Referring to FIG. 8, the control signal generating circuit 631 includes PMOS transistors 811 and 814 through 815, NMOS transistors 811 through 813 and 851, transmission gates 821 through 825, inverters 831 through 836, latch circuits 841 through 845, a NAND gate 861, and buffers 871–872. The control signal generating circuit 631 receives the power supply sense signal PVCCH, the first and second mode register signals ORGSET and MRSET, a third internal signal PMRSPD, and mode register address signals MRA9B and MRA10B and generates the first through third control signals ORGSM, MHE, and MFE.

The first control signal ORGSM is at the logic high level when the power supply sense signal PVCCH and the first mode register signal ORGSET are at the logic high level. When the first mode register signal ORGSET is at the logic high level, the transmission gate 821 is turned on. In this state, when the power supply sense signal PVCCH is at the logic high level, the output of the inverter 831 is at the logic low level, thus turning on the PMOS transistor 811. Then, the supply voltage Vcc is applied to the latch circuit 841 through the transmission gate 821 and the output of the latch circuit 841 transitions to the logic low level. Since the output of the latch circuit 841 is inverted by the inverter 832, the first control signal ORGSM is at the logic high level. The first control signal ORGSM is disabled to the logic low level when the supply voltage Vcc is cut off or the second mode register signal MRSET is at the logic high level. When the supply voltage Vcc is cut off, the power supply sense signal PVCCH transitions to the logic low level. Then, the output of the NAND gate 861 transitions to the logic high level, thus turning on the NMOS transistor 851. When the second mode register signal MRSET is at the logic high level, the output of the inverter 833 is at the logic low level, thus turning on the NMOS transistor 851. When the NMOS transistor 851 is turned on, the first control signal ORGSM is at the logic low level.

The third control signal MHE is at the logic high level when the first mode register signal ORGSET and the third internal signal PMRSPD are at the logic high level and the mode register address signal MRA9B is at the logic low level. When the first mode register signal ORGSET and the third internal signal PMRSPD are at the logic high level, the transmission gates 822 and 823 are turned on.

As shown in FIG. 10, the third internal signal PMRSP is activated to the logic high level when the clock signal CLK transitions from the logic low level to the logic high level in a state where the write enable signal WEB, the row address strobe signal RASB, and the column address strobe signal CASB are at the logic low level. Also, the third internal signal PMRSP is deactivated to the logic low level when the clock signal CLK transitions from the logic low level to the logic high level in a state where one of the write enable signal WEB, the row address strobe signal RASB, and the column address strobe signal CASB is at the logic high level. The third internal signal PMRSP can be replaced by the second internal signal PWCBR.

When the mode register address signal MRA9B is at the logic low level, the mode register address signal MRA9B is input to the latch circuit 842 through the transmission gate 822. Since the latch circuit 842 inverts an input, the output of the latch circuit 842 is at the logic high level. The output of the latch circuit 842 is inverted by the inverter 834, passes through the transmission gate 823, and is input to the latch circuit 843. The latch circuit 843 outputs the logic high level, which is buffered and output by the buffer 871 as the third control signal MHE. Therefore, the third control signal MHE is activated to the logic high level.

The second control signal MFE is at the logic high level when the first mode register signal ORGSET and the third internal signal PMRSPD are at the logic high level and the mode register address signal MRA10B is at the logic low level. When the first mode register signal ORGSET and the third internal signal PMRSPD are at the logic high level, the transmission gates 824 and 825 are turned on. When the mode register address signal MRA10B is at the logic low level in this state, the mode register address signal MRA10B is input to the latch circuit 844 through the transmission gate 824. Since the latch circuit 844 inverts an input, the output of the latch circuit 844 is at the logic high level. The output of the latch circuit 844 is inverted by the inverter 836, passes through the transmission gate 825, and is input to the latch circuit 845. The latch circuit 845 outputs the logic high level, which is buffered and output by the buffer 872 as the second control signal MFE. Therefore, the second control signal MFE is at the logic high level.

Figure 9:
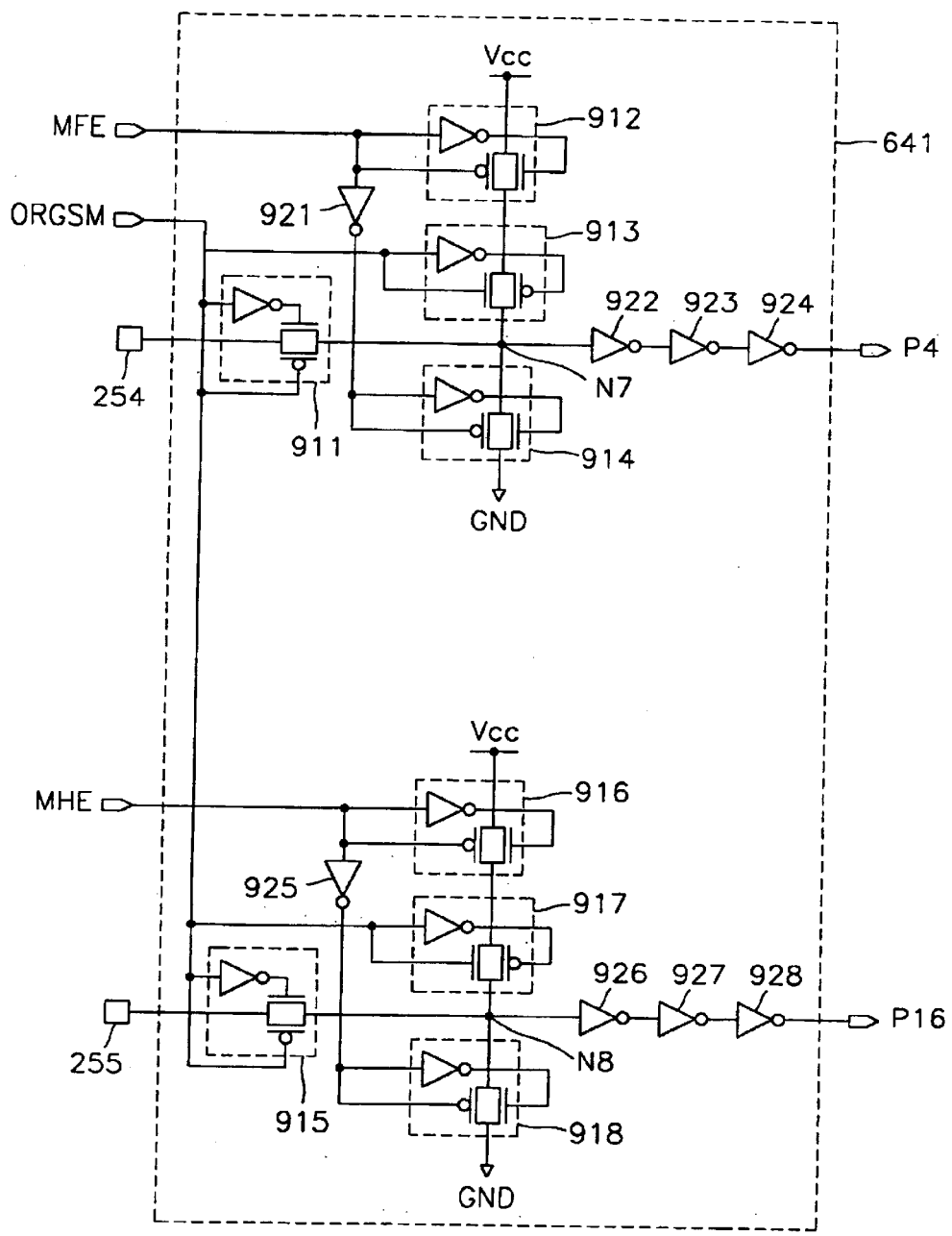
FIG. 9 is a circuit diagram of the input and output mode signal generating circuit shown in FIG. 6.

The input and output mode signal generating circuit 641 is shown in detail in FIG. 9. Referring to FIG. 9, the input and output mode signal generating circuit 641 electrically connected to the pads 254 and 255 includes transmission gates 911 through 918 and inverters 921 through 928. The input and output mode signal generating circuit 641 receives the first through third control signals ORGSM, MFE, and MHE and generates the input and output mode signals P4 and P16. When the first control signal ORGSM is at the logic high level, the transmission gates 913 and 917 are turned on and the transmission gates 911 and 915 are turned off. Accordingly, signals input to the input and output mode set circuit 641 through the pads 254 and 255 are cut off. In this state, when the second control signal MFE is at the logic high level, the input and output mode signal P4 is enabled to the logic high level. Accordingly, the input and output mode of the semiconductor memory device 201 is set to be ×4. When the third control signal MHE is at the logic high level, the input and output mode signal P16 is enabled to the logic high level. Accordingly, the input and output mode of the semiconductor memory device 201 is set to ×16. The second and third control signals MFE and MHE are never both simultaneously at the logic high level. When the second and third control signals MFE and MHE are at the logic low level, the input and output mode signals P4 and P16 are at the logic low level. Accordingly, the input and output mode of the semiconductor memory device 201 is set to ×8.

When the second control signal MFE is at the logic high level in a state where the first control signal ORGSM is at the logic high level, the transmission gate 912 is turned off and the transmission gate 914 is turned on since the output of the inverter 921 is at the logic low level. Therefore, since a node N7 is at the ground voltage GND level, which is inverted by the inverters 922 through 924, the input and output mode signal P4 is enabled to the logic high level. When the second control signal MFE is at the logic low level, the transmission gate 914 is turned off and the transmission gate 912 is turned on. Therefore, since the node N7 is at the supply voltage Vcc level, which is inverted by the inverters 922 through 924, the input and output mode signal P4 is disabled to the logic low level.

When the third control signal MHE is at the logic high level in a state where the first control signal ORGSM is at the logic high level, the transmission gate 916 is turned off and the transmission gate 918 is turned on since the output of the inverter 925 is at the logic low level. Therefore, since a node N8 is at the ground voltage GND level, which is inverted by the inverters 926 through 928, the input and output mode signal P16 is at the logic high level. When the third control signal MHE is at the logic high level, the transmission gate 918 is turned on and the transmission gate 916 is turned off. Therefore, since a node N8 is at the ground voltage GND level, which is inverted by the inverters 926 through 928, the input and output mode signal P16 is enabled to the logic high level. When the third control signal MHE is at the logic low level, the transmission gate 918 is turned off and the transmission gate 916 is turned on. Therefore, since the node N8 is at the supply voltage Vcc level, which is inverted by the inverters 926 through 928, the input and output mode signal P16 is disabled to the logic low level.

It is possible to easily set the input and output mode of the semiconductor memory device 201 using the mode register address signals MRA4B through MRA10B. Therefore, it is possible to completely characterize the semiconductor memory device 201 in each input and output mode even after the device is packaged.

In FIGS. 2 and 6, it is described that the semiconductor memory device 201 has three input and output modes. However, the number of input and output modes of the semiconductor memory device 201 can be less than or greater than 3. For example, the input and output modes of the semiconductor memory device 201 can be set to ×32, ×64, and ×128.

According to the present invention, it is possible to easily externally control the data input and output mode of the semiconductor memory device 201. Therefore, productivity of the semiconductor memory device is improved and the driving capability difference between the input and output mode of the semiconductor memory device is removed. Accordingly, the test efficiency increases. Also, it is possible to completely characterize the semiconductor memory device in each input and output mode.

In the drawings and specification, there have been disclosed typical preferred embodiments of the invention and, although specific terms are employed, they are used a generic and descriptive sense only and not for purposes of limitation, the scope of the invention being set forth in the following claims. Therefore, it will be understood by those skilled in the art that various changes in form and details may be made therein without departing from the spirit and scope of the invention as defined by the appended claims.

What is claimed is:

1. A semiconductor memory device, comprising:
   a first plurality of pads to receive a corresponding plurality of first external signals;
   a second plurality of pads to receive a corresponding plurality of second external signals; and
   an input and output mode set circuit coupled with the first and second plurality of pads to generate a plurality of input and output mode signals responsive to the plurality of first and second external signals;
   wherein, during a test mode, the input and output mode set circuit is adapted to generate the plurality of input and output mode signals responsive only to the plurality of first external signals, the plurality of first pads receiving a high voltage higher than a voltage level of a power supply signal thereby generating a plurality of first external signals having a level higher than a voltage level of the power supply signal;
   wherein, during normal operations, the input and output mode set circuit is adapted to generate the plurality of input and output mode signals responsive to the plurality of second external signals, the plurality of second external signals having logic levels.

2. The semiconductor memory device of claim 1 wherein the power supply signal is applied to the semiconductor memory device after the high voltage is applied to one of the first plurality of pads.

3. The semiconductor memory device of claim 1 wherein the plurality second pads float.

4. The semiconductor memory device of claim 1 wherein at least one of the plurality of second pads is grounded to a ground terminal of the semiconductor memory device.

5. The semiconductor memory device of claim 1 wherein the input and output mode set circuit comprises:
   a pad circuit coupled with the first plurality of pads, to generate a plurality of first signals, one of the plurality of first signals being active when the high voltage is applied to at least one of the first plurality of pads;
   a control signal generating circuit to generate a plurality of control signals responsive to the plurality of first signals and a plurality of second signals; and
   an input and output mode signal generating circuit to generate the plurality of input and output mode signals responsive to the plurality of control signals and the plurality of second external signals.

6. The semiconductor memory device of claim 5 wherein the plurality of second signals comprises a power supply sense signal activated when the power supply signal has a level equal to or greater than a predetermined level and input and output mode control signal activate responsive to a write enable signal, a row address strobe signal, and a column address strobe signal.

7. The semiconductor memory device of claim 1 wherein the high voltage is applied to the plurality of first pads only for a short period of time.

8. A semiconductor memory device, comprising:
   a plurality of pads for receiving a corresponding plurality of external signals; and
   an input and output mode set circuit coupled with the plurality of pads, to generate a plurality of input and output mode signals;
   wherein, during a test mode, the input and output mode set circuit is adapted to generate the plurality of input and output mode signals responsive to a plurality of mode register address signals; and
   wherein, during normal operation, the input and output mode set circuit is adapted to generate the plurality of input and output mode signals responsive to the plurality of external signals received at the plurality of pads.

9. The semiconductor memory device of claim 8 wherein each of the plurality of pads float.

10. The semiconductor memory device of claim 9 wherein at least one of the plurality of pads is grounded.

11. The semiconductor memory device of claim 8 wherein the plurality of pads includes two pads.

12. The semiconductor memory device of claim 8 wherein the input and output mode set circuit comprises:

a mode register set circuit to receive a group of the plurality of mode register address signals and first and second internal signals and to generate first and second mode register signals responsive to the group of mode register address signals and the first and second internal signals;

a control signal generating circuit to generate a plurality of control signals responsive to the first and second mode register signals, a remaining group of the plurality of mode register address signals, the first internal signal, and a third internal signal; and an input and output signal generator to receive the plurality of control signals, cut off signals the plurality of external control signals responsive to at least one of the plurality of control signals, and generate the plurality of input and output mode signals responsive to the remaining control signals.

13. The semiconductor memory device of claim 12 wherein the first internal signal is a power supply sense signal enabled when a power supply has a level equal to or greater than a predetermined level and the second internal signals is enabled when a write enable signal, a row address strobe signal, and a column address strobe signal are enabled.

14. The semiconductor memory device of claim 12 wherein, during the normal operation, the second mode register signal and the first and second internal signals are deactivated thereby deactivating the first, second, and third control signals and wherein the input and output mode signal generating circuit is adapted to generate the input and output mode signals responsive to the plurality of external signals.

* * * * *

UNITED STATES PATENT AND TRADEMARK OFFICE
CERTIFICATE OF CORRECTION

PATENT NO. : 6,845,407 B1
DATED : January 18, 2005
INVENTOR(S) : Park et al.

It is certified that error appears in the above-identified patent and that said Letters Patent is hereby corrected as shown below:

Column 2,
Line 17, replace "reduced cause the driving" with -- reduced because the driving --.

Column 3,
Line 52, replace "external signals" with -- external signals. --.

Column 9,
Line 33, replace "ORGSM. MHE, and MFE." with -- ORGSM, MHE, AND MFE. --.

Column 14,
Line 1, replace "output signal" with -- output mode signal --.

Signed and Sealed this

Twenty-first Day of March, 2006

JON W. DUDAS
*Director of the United States Patent and Trademark Office*